United States Patent
Liao et al.

(10) Patent No.: US 11,699,669 B2
(45) Date of Patent: Jul. 11, 2023

(54) SEMICONDUCTOR PACKAGE DEVICE WITH INTEGRATED INDUCTOR AND MANUFACTURING METHOD THEREOF

(71) Applicant: TAIWAN SEMICONDUCTOR MANUFACTURING COMPANY LTD., Hsinchu (TW)

(72) Inventors: Wen-Shiang Liao, Miaoli County (TW); Huan-Neng Chen, Taichung (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 17/808,997

(22) Filed: Jun. 26, 2022

(65) Prior Publication Data

US 2022/0336382 A1    Oct. 20, 2022

Related U.S. Application Data

(62) Division of application No. 15/964,881, filed on Apr. 27, 2018, now Pat. No. 11,380,632.

(51) Int. Cl.
| | |
|---|---|
| *H01L 23/64* | (2006.01) |
| *H01L 25/065* | (2023.01) |
| *H01L 23/498* | (2006.01) |
| *H01L 21/48* | (2006.01) |
| *H01L 25/00* | (2006.01) |

(Continued)

(52) U.S. Cl.
CPC ........ *H01L 23/645* (2013.01); *H01L 21/4853* (2013.01); *H01L 21/4857* (2013.01); *H01L 23/49816* (2013.01); *H01L 23/49822* (2013.01); *H01L 25/0655* (2013.01); *H01L 25/50* (2013.01); *H01F 27/24* (2013.01); *H01F 2027/2809* (2013.01)

(58) Field of Classification Search
CPC ............... H01L 23/645; H01L 21/4853; H01L 21/4857; H01L 23/49816; H01L 23/49822; H01L 25/0655; H01L 25/50
USPC ......................................................... 257/668
See application file for complete search history.

(56) References Cited

U.S. PATENT DOCUMENTS

2005/0122198 A1\*  6/2005  Zhou ..................... H01F 41/046
                                                                336/200

\* cited by examiner

*Primary Examiner* — Quoc D Hoang
(74) *Attorney, Agent, or Firm* — WPAT Law; Anthony King

(57) ABSTRACT

A method includes: forming an interconnect structure over a semiconductor substrate. The interconnect structure includes: a magnetic core and a conductive coil winding around the magnetic core and electrically insulated from the magnetic core, wherein the conductive coil has horizontally-extending conductive lines and vertically-extending conductive vias electrically connecting the horizontally-extending conductive lines, wherein the magnetic core and the conductive coil are arranged in an inductor zone of the interconnect structure. The interconnect structure also includes a dielectric material electrically insulating the magnetic core from the conductive coil, and a connecting metal line adjacent to and on the outside of the inductor zone. The connecting metal line is electrical isolated from the inductor zone. The connecting metal line includes an upper surface lower than an upper surface of the second conductive vias and a bottom surface higher than a bottom surface of the first conductive vias.

20 Claims, 15 Drawing Sheets

(51) Int. Cl.
*H01F 27/28* (2006.01)
*H01F 27/24* (2006.01)

SEMICONDUCTOR PACKAGE DEVICE WITH INTEGRATED INDUCTOR AND MANUFACTURING METHOD THEREOF

PRIORITY CLAIM AND CROSS-REFERENCE

The present application is a divisional application claiming the benefit of and priority to U.S. application Ser. No. 15/964,881 filed Apr. 27, 2018, the entire content of which is incorporated herein by reference.

BACKGROUND

In modern semiconductor devices and systems, progress in component integration and miniaturization has taken place at an increasingly rapid pace. One increasingly important challenge in the manufacture of modern semiconductor package devices is the integration of inductors. Conventional inductors usually occupy a considerable amount of space in an electronic device for pursuing desirable performance. However, the size of the inductor makes it difficult for conventional inductor designs to be integrated with downsized semiconductor chips. Thus, an enhanced integrated inductor structure and a method of manufacturing the same are in need.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
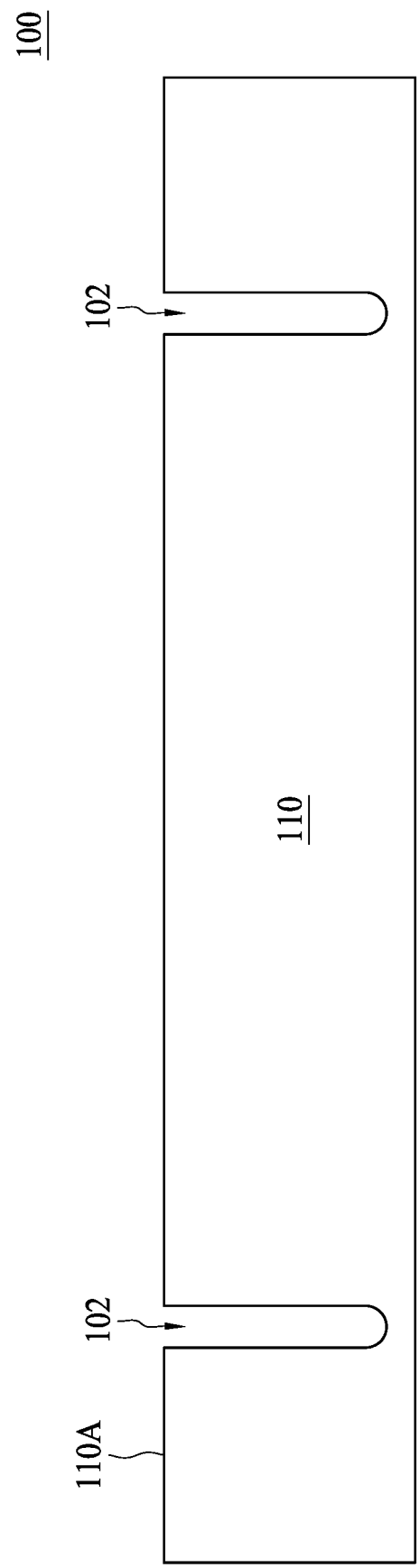
FIGS. 1 through 8 and FIGS. 10 through 14 are cross-sectional views of intermediate structures for a method of manufacturing a semiconductor package device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the terms "approximate," "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to 3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1, less than or equal to ±0.5°, less than or equal to ±0.1°, or less than or equal to ±0.05°.

The present disclosure provides a semiconductor package device integrated with an on-chip inductor and its associated manufacturing operations, according to various embodiments. The inductor is an indispensable component in many aspects of modern semiconductor electronics, such as sensors, transformers, power management circuits, charging circuits and radio-frequency circuits. However, as the size of the packaged semiconductor device continues to shrink, the miniaturization of the inductor has drawn attention as a key step necessary to successfully reduce the dimensions of the packaged device. To address such need, a miniaturized on-chip inductor is proposed that is produced using techniques common to fabrication of semiconductor devices, such as lithography, etching, and deposition. Compared to the conventional inductor comprised of enameled wires, the proposed on-chip inductor has a smaller size. Moreover, the configuration and properties of the semiconductor-based inductor are improved due to design of the semiconductor manufacturing operations. As a result, the resultant inductor-embedded package device renders better inductor performance and integration efficiency with a reduced device size.

FIGS. 1 through 8 and FIGS. 10 through 14 are cross-sectional views of intermediate structures for a method of manufacturing a semiconductor package device 100, in accordance with some embodiments. The semiconductor package device 100 may be an electronic device, such as a sensor, a transformer, a power management integrated circuit (IC), a wireless charger device, or a radio-frequency transmitter/receiver. Referring to FIG. 1, a substrate 110 is received or provided. The substrate 110 includes a semiconductor material, such as silicon. In an embodiment, the substrate 110 may include other semiconductor materials, such as silicon germanium, silicon carbide, gallium arsenide, or the like. The substrate 110 may be a p-type semiconductive substrate (acceptor type) or an n-type semiconductive substrate (donor type). Alternatively, in various applications the substrate 110 may include another elementary semiconductor, such as germanium; a compound semiconductor including silicon carbide, gallium arsenic, gallium phosphide, indium phosphide, indium arsenide, or indium antimonide; an alloy semiconductor including SiGe, GaAsP, AlInAs, AlGaAs, GaInAs, GaInP, or GaInAsP; or combinations thereof. In the present embodiment, the substrate 110 is an interposer substrate formed of bulky silicon. Conductive vias may be formed in the substrate to electrically couple components on opposite sides of the substrate 110. In some embodiments, the substrate 110 may be substantially free of active devices, such as transistors, or passive devices, such as resistors, capacitors or inductors, in addition to the conductive vias.

Referring to FIG. 1, several recesses 102 are formed through a surface 110A of the substrate 110. An etching operation is performed on the substrate 110 to form the recesses 102. In some embodiments, the etching operation may be a dry etch, a wet etch, or a combination thereof. In the depicted embodiment, a dry etch or a reactive ion etching (RIE) operation is adopted. Although not shown, a photoresist layer may be formed over the substrate 110 to define the geometry of the recesses 102. Furthermore, after the recesses 102 are formed, the photoresist layer may be cleaned or stripped.

Figure 2:
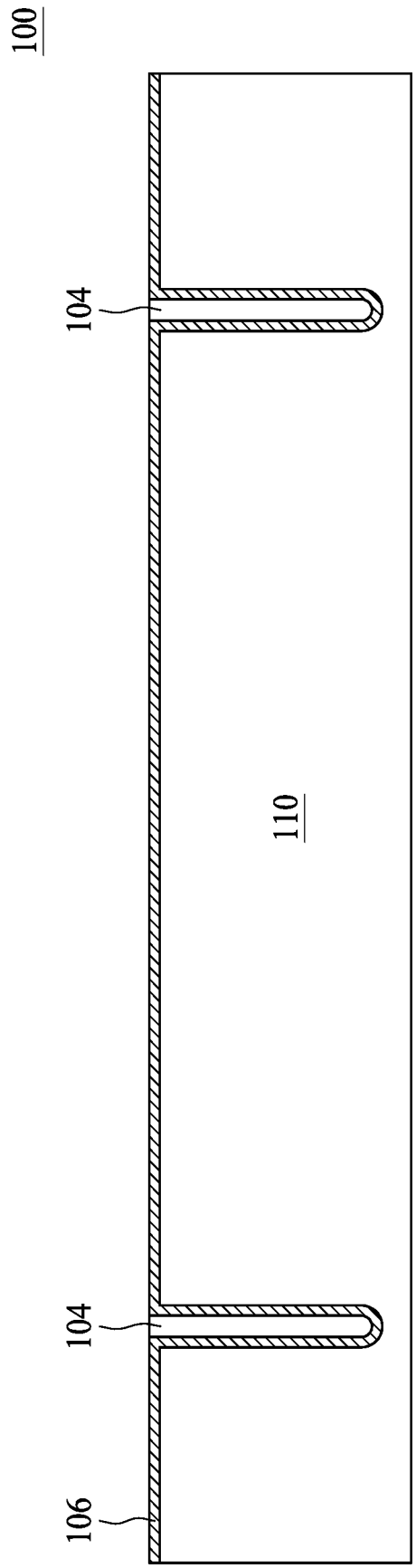

FIG. 2 shows the forming of conductive vias 104 in the recesses 102. In some embodiments, a protection layer 106 is initially formed on the substrate 110 before the conductive vias 104 are formed. The protection layer 106 may line sidewalls and the bottoms of the recesses 102. The protection layer 106 may be formed of a dielectric material, such as silicon oxide, silicon nitride, silicon oxynitride, or the like. The protection layer 106 may be formed using chemical vapor deposition (CVD), physical vapor deposition (PVD), atomic layer deposition (ALD), spin-on coating, or the like.

The conductive vias 104 are formed over the protection layer 106 and in the recesses 102. In some embodiments, the conductive vias 104 act as through-interposer vias of the semiconductor package device 100. The conductive vias 104 are made of a conductive material such as copper, tungsten, titanium, aluminum, silver, combinations thereof, or the like. The conductive vias 104 may be formed by CVD, PVD, ALD, electroplating, or other suitable methods. The conductive vias 104 may be formed by forming a conductive material over the substrate 110 and into the recesses 102. Afterwards, excess conductive materials may be removed by a planarization operation, such as grinding or chemical mechanical polishing (CMP). Accordingly, the conductive vias 104 are level with horizontal portions of the protection layer 106.

FIG. 3 through FIG. 8 illustrate cross-sectional views of intermediate structures of the process of forming an interconnect structure 120, in accordance with various embodiments. The interconnect structure 120, also known as a redistribution layer (RDL), is widely applied in semiconductor circuits in order to provide rerouted interconnections between components on one side of an interconnect structure, such as the interconnect structure 120. In some embodiments, the interconnect structure 120 is configured to electrically couple components on different sides of the interconnect structure 120. The interconnect structure 120 generally includes stacked metallization layers comprised of conductive features connected with each other to establish the interconnection routes, e.g., metallization layers 212, 213, 214, 215 and 216 shown in FIG. 3 through FIG. 8. Each of the metallization layers may include conductive lines or vias in which the conductive lines are electrically coupled to an adjacent overlaying or underlying conductive line through intervening conductive vias. The metal lines and metal vias are electrically insulated by insulating materials, usually referred to as an inter-metal dielectric (IMD). Moreover, an inductor 200 (see FIG. 9A) is formed and embedded in the interconnect structure 120. Components of the inductor 200, e.g., a magnetic core and a coil, are simultaneously formed during forming of the conductive lines and vias of the interconnect structure 120. Accordingly, the semiconductor device comprised of the substrate 110 and the interconnect structure 120 may also be referred to as an inductor device. However, in some embodiments, the configurations and materials of the interconnection conductive lines and vias foreign to the inductor 200 may be different from those of the inductor 200, as described in subsequent paragraphs.

Figure 3:
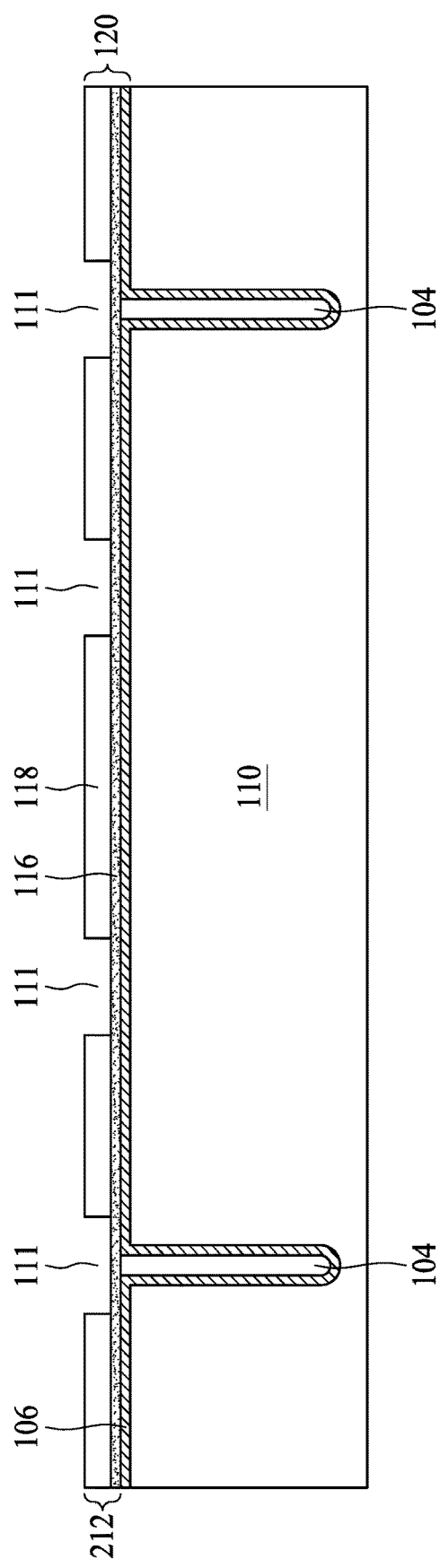

Initially, as illustrated in FIG. 3, a first metallization layer 212 is formed over the substrate 110. In some embodiments, a first dielectric layer 116 and a second dielectric layer 118, collectively referred to as the IMD of the first metallization layer 212, are sequentially formed with dielectric materials in a blanket manner over the substrate 110. In some embodiments, the first dielectric layer 116 is eliminated and is not present in the formation of the first metallization layer 212. In some embodiments, the first dielectric layer 116 comprises silicon oxide, silicon nitride, silicon oxynitride, silicon carbide, or the like. In some embodiments, the second dielectric layer 118 comprises oxide, such as un-doped silicate glass (USG), fluorinated silicate glass (FSG), borophosphosilicate glass (BPSG), tetraethosiloxane (TEOS), spin-on glass (SOG), high-density plasma (HDP) oxide, plasma-enhanced TEOS (PETEOS), or the like. The first dielectric layer 116 and the second dielectric layer 118 may include different dielectric materials. The first dielectric layer 116 and the second dielectric layer 118 may be formed by CVD, PVD, ALD, spin-on coating, or other suitable operations.

Once deposited, the first dielectric layer 116 and the second dielectric layer 118 are patterned. Several recesses 111 are formed through the first dielectric layer 116 and the second dielectric layer 118 using a patterning operation. In some embodiments, the patterning operation involves a lithography operation and an etching operation in a manner similar to that used during the forming of the vias 104. Some of the recesses 111 may be aligned with the underlying conductive vias 104 to expose the conductive vias 104 and portions of the protection layer 106. The etching operation may be dry etch, wet etch, or a combination thereof. Although not shown in the figure, each of the recesses 111 may have a strip shape extending in a horizontal direction substantially parallel to the surface 110A of the substrate 110.

Figure 4:
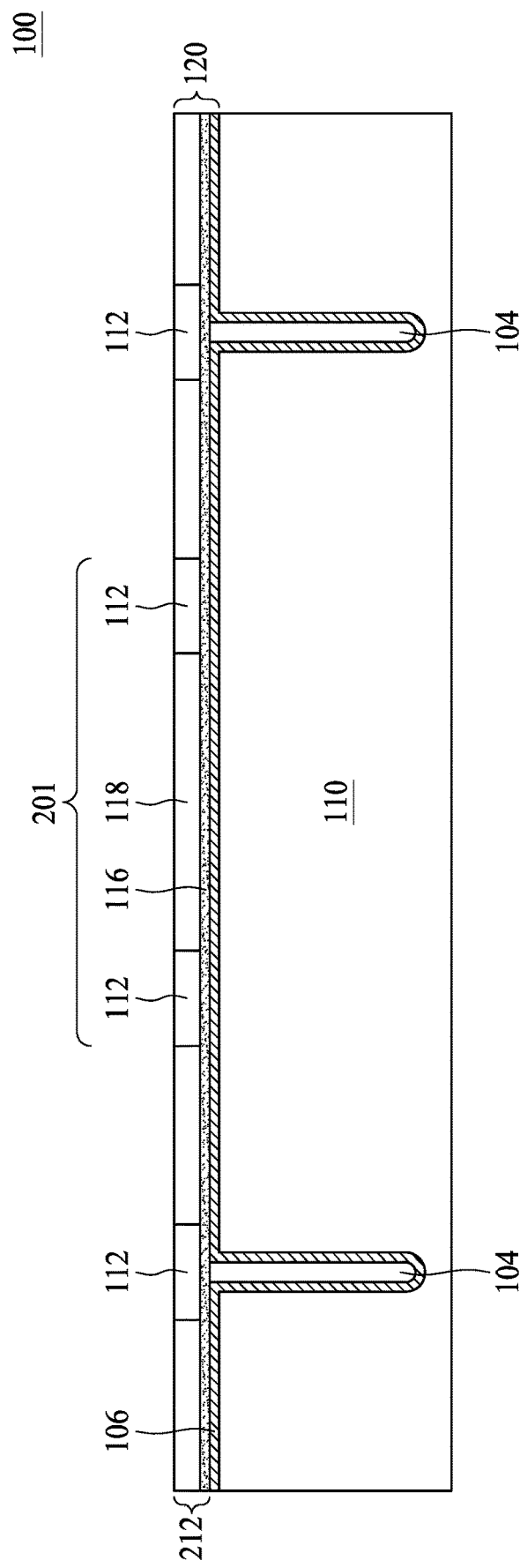

Referring to FIG. 4, metal lines 112 are formed in the recesses 111. The metal lines 112 may be formed of conductive materials, such as titanium, copper, silver, aluminum, gold, tungsten, combinations thereof, or the like. The metal lines 112 may be formed by depositing the conductive material using CVD, PVD, ALD or other suitable methods. In some embodiments, a planarization operation, such as grinding or CMP, may be utilized to level upper surfaces of the metal lines 112 and the second dielectric layer 118. Thus, the first metallization layer 212 is completed. As shown in FIG. 4, an inductor zone 201 is defined for the inductor 200 where the metal lines 112 within the inductor zone 201 are used as components of the inductor 200. The conductive lines or vias within the inductor zone 201 that are configured to perform the function of the inductor 200 may be electrically isolated from other conductive components, such as the metal lines 112 outside of the inductor zone 201. The metal lines 112 outside the inductor zone 201 may serve as an interconnection route and may be configured for interconnecting devices or components of the semiconductor package device 100 on both sides of the interconnect structure 120.

Figure 5:
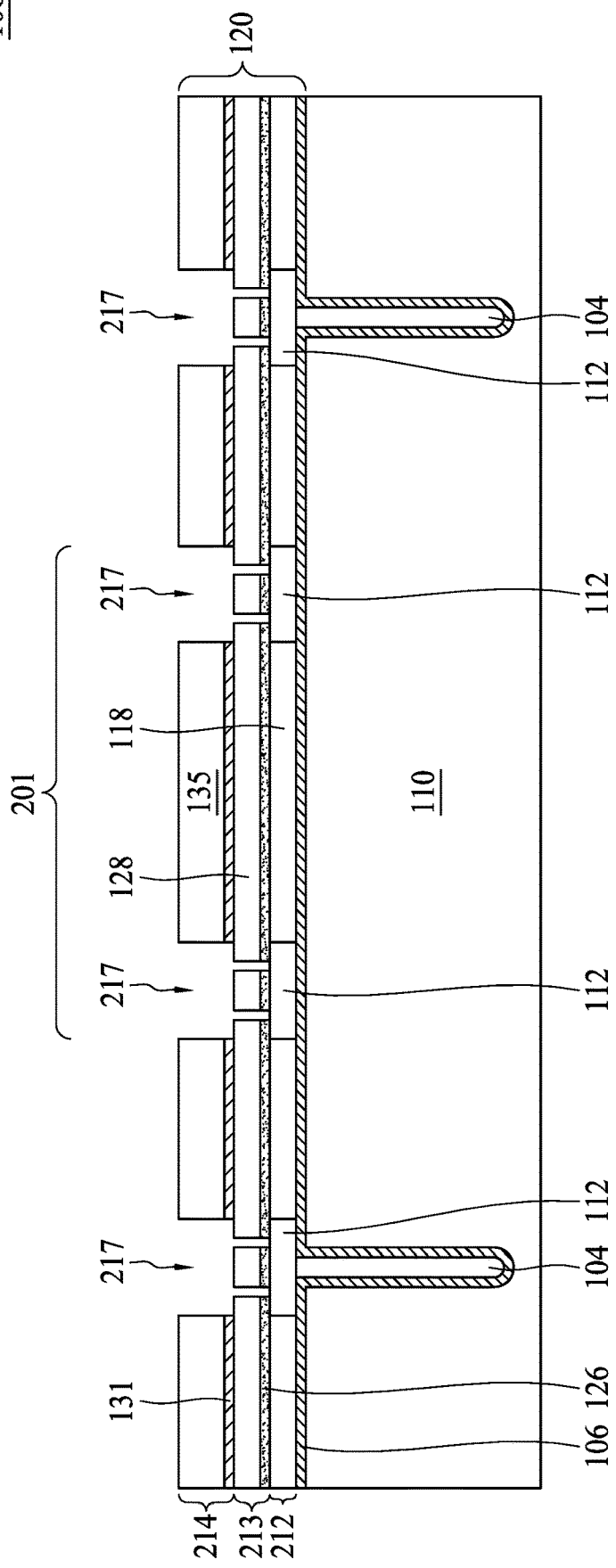

Next, a second metallization layer 213 and a third metallization layer 214 are successively formed over the first metallization layer 212 in FIG. 5. The configurations and manufacturing methods of the second metallization layer 213 and the third metallization layer 214 are similar to those of the first metallization layer 212. The first dielectric layer 116 of the first metallization layer 212 is omitted from the current and subsequent figures for simplicity. In some embodiments, the second metallization layer 213 includes a first dielectric layer 126 and a second dielectric layer 128 that are sequentially formed in a blanket manner over the first metallization layer 212. Similarly, the third metallization layer 214 includes a first dielectric layer 131 and a second dielectric layer 135 that are sequentially formed in a blanket manner over the second metallization layer 213.

In some embodiments, the first dielectric layer 126 of the second metallization layer 213 comprises a dielectric material such as silicon oxide, silicon nitride, silicon oxynitride, silicon carbide, or the like. In some embodiments, the second dielectric layer 128 of the second metallization layer 213 comprises oxide, such as USG, FSG, BPSG, TEOS, SOG, HDP oxide, PETEOS, or the like. In some embodiments, the first dielectric layer 126 and the second dielectric layer 128 may include different dielectric materials. The first dielectric layer 126 and the second dielectric layer 128 may be formed by CVD, PVD, ALD, spin-on coating, or other suitable operations.

In some embodiments, the first dielectric layer 136 of the third metallization layer 214 comprises a dielectric material such as silicon oxide, silicon nitride, silicon oxynitride, silicon carbide, or the like. In some embodiments, the second dielectric layer 135 of the third metallization layer 214 comprises oxide, such as USG, FSG, BPSG, TEOS, SOG, HDP oxide, PETEOS, or the like. In some embodiments, the first dielectric layer 136 and the second dielectric layer 135 of the third metallization layer 214 may include different dielectric materials. In some embodiments, the first dielectric layer 116 of the first metallization layer 212, the first dielectric layer 126 of the second metallization layer 213 and the first dielectric layer 136 of the third metallization layer 214 may be formed of different dielectric materials, e.g. the dielectric layers 126 and 136 are formed of silicon carbide and silicon nitride, respectively. The first dielectric layer 136 and the second dielectric layer 135 may be formed by CVD, PVD, ALD, spin-on coating, or other suitable operations.

Still referring to FIG. 5, after the second dielectric layer 135 is formed, several recesses 211 and 217 are formed in the second metallization layer 213 and the third metallization layer 214. Some recesses, e.g., the recesses 217, may be aligned with and expose their underlying metal lines 112. The recesses 211 and 217 may be formed using an etching operation, such as dry etch, wet etch, or a combination thereof. The recesses 211 and 217 may have an upper portion in the third metallization layer 214 and a lower portion in the second metallization layer 213. In some embodiments, the upper portion of the recess 211 or 217 has a width larger than a width of the lower portion of the corresponding recess 211 or 217. In some embodiments, the lower portion of each recess 211 or 217 includes more than one vias exposing the corresponding metal line 112. Each of the vias in the lower portion of the recess 211 or 217 has a width smaller than the width of the upper portion of the corresponding recess 211 or 217. In some embodiments, the upper portion of the recess 211 within the inductor zone 201 has a polygonal or circular shape. In some embodiments, the upper portion of the recess 217 outside the inductor zone 201 has a strip-like shape extending in a horizontal direction substantially parallel to the surface 110A of the substrate 110.

Figure 6:
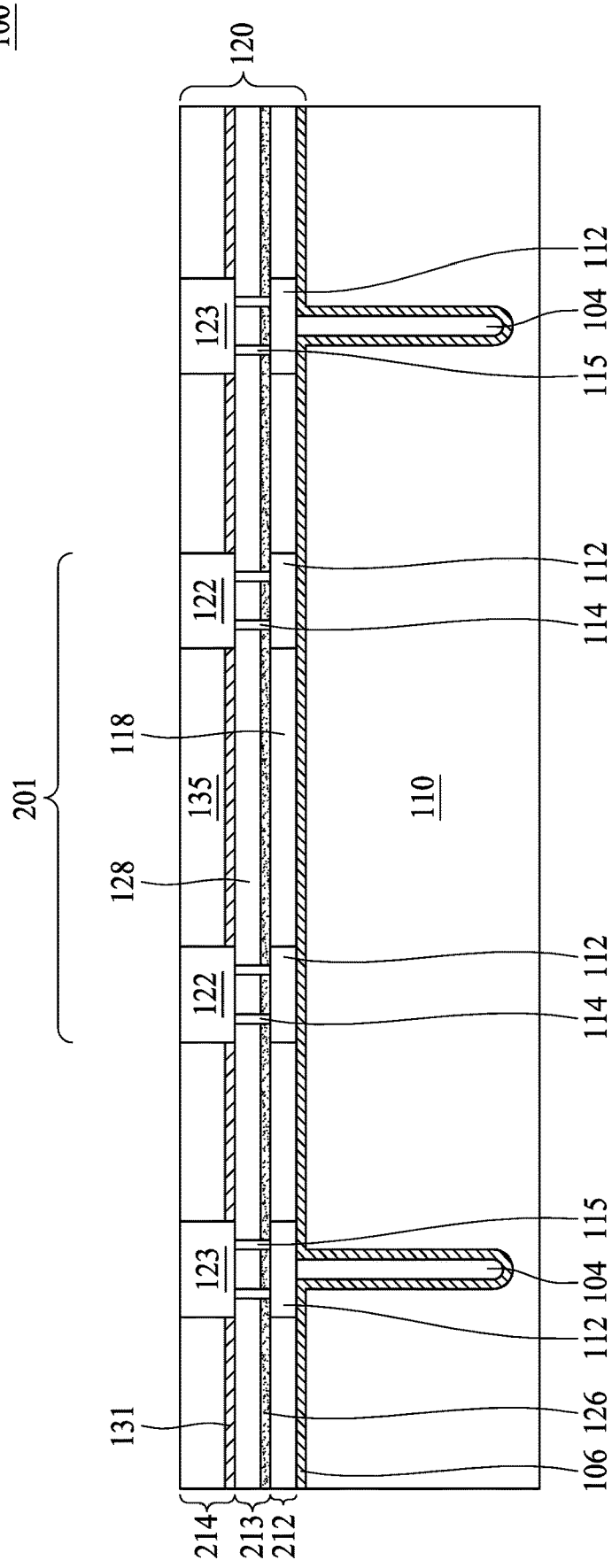

Referring to FIG. 6, metal lines 123 are formed in the upper portions of the recesses 111. Additionally, metal vias 114, 115 and 122 are formed in the lower portions of the recesses 111 during a same formation operation of the metal lines 123. The materials and forming methods of the metal lines 123 and the metal vias 114, 115 and 122 may be similar to those of the metal lines 112. In some embodiments, metal vias 114 and 122 within the inductor zone 201 that are configured to perform the function of the inductor 200 may be electrically isolated from other conductive components, such as the metal lines 123 or metal vias 115 outside the inductor zone 201. The metal lines 123 and the metal vias 115 outside the inductor zone 201 may be configured for interconnecting devices or components of the semiconductor package device 100 on both sides of the interconnect structure 120. In some embodiments, the metal vias 122 within the inductor zone 201 may have a circular or polygonal shape serving as a node of conduction electrically coupling the metal vias 114 and overlying metal vias (e.g., metal vias 314 in FIG. 8). In some embodiments, the metal vias 122 have a first width greater than a second width of the metal vias 114 from a cross-sectional view of top-view perspective for ensuring robust electrical connection between them. In some embodiments, the metal vias 122 have a first area from a top-view perspective greater than a second area of the metal vias 114 from a top-view perspective.

Figure 7:
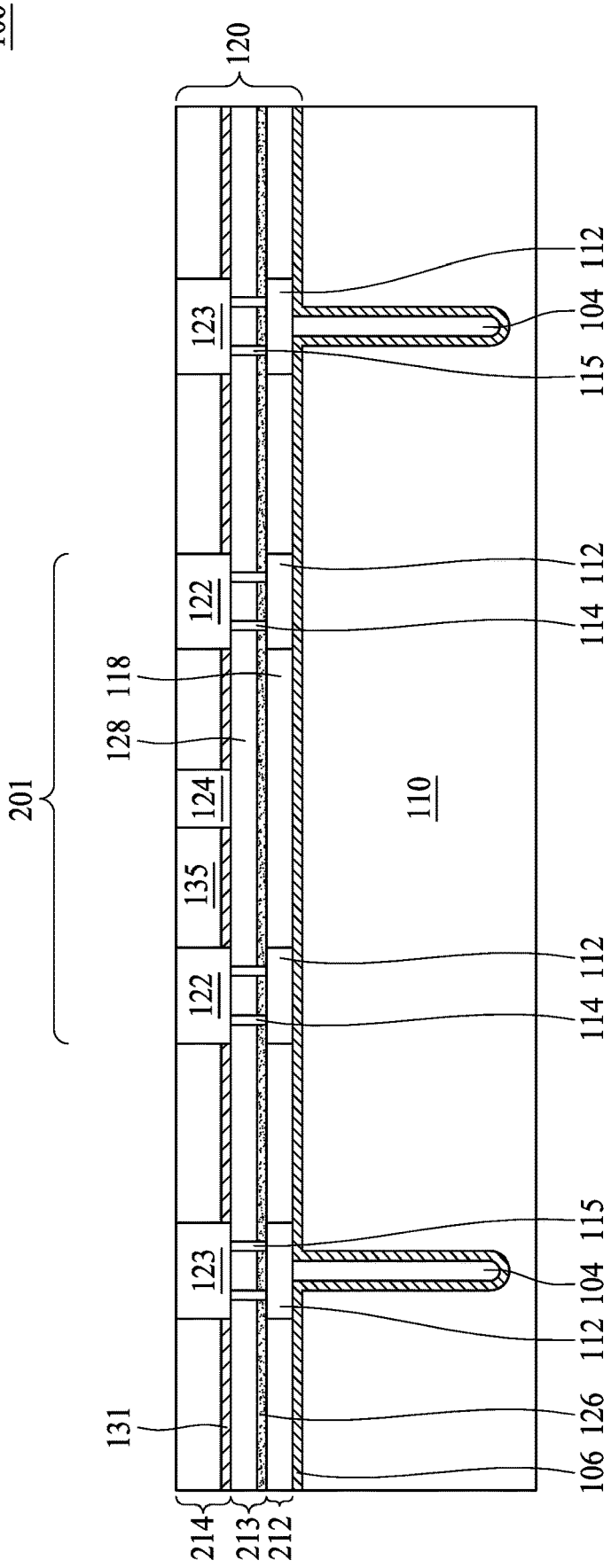

FIG. 7 illustrates the formation of a magnetic core 124 as a magnetic region in the third metallization layer 214. The methods of forming the magnetic core 124 are similar to those of the forming of the metal lines 112 and 123 or the forming of the metal vias 114, 115 and 122. For example, a recess may be initially formed in the second metallization layer 213. In some embodiments, a photoresist, different from that used for forming the metal lines 123 or the metal vias 122, may be patterned to specifically define the geometry of the recess. Next, an etching operation is performed to form the recess. A magnetic material is subsequently deposited to fill the recess. The chosen magnetic material of the magnetic core 124 possesses a high permeability coefficient. The magnetic material may have a low hysteresis coefficient. Further, the magnetic material may possess a low conductivity in order to mitigate the induced Eddy current. In contrast, the metal line 112 and the metal vias 114 and 122 are made of highly conductive materials, such as copper, in order to reduce conduction resistance.

In some embodiments, a first magnetic material of the magnetic core 124 comprises nickel, zinc and copper with percentages of 40%, 20% and 20%, respectively, plus ferric oxide (e.g., $Fe_2O_4$) with a relatively lower percentage. In some embodiments, the magnetic core 124 has a second magnetic material comprised of yttrium and bismuth with percentages of 80% and 20%, respectively, plus ferric oxide (e.g., $Fe_5O_{12}$) with a relatively lower percentage. The first magnetic material or the second magnetic material may be formed by spin-coating.

In some embodiments, the magnetic core 124 has a third magnetic material comprised of nickel and iron with percentages of 80% and 20%, respectively. The third magnetic material may be formed by electroplating or PVD (e.g., sputtering). In some embodiments, the magnetic core 124 has a fourth magnetic material comprised of cobalt, zirconium and tantalum (also referred to as CZT) with percentages of 91.5%, 4% and 4.5%, respectively. The fourth magnetic material may be formed by the sputtering operation.

In some embodiments, the magnetic core 124 is disposed above the second metallization layer 213. In some embodiments, the magnetic core 124 is disposed at the tier of the third metallization layer 214. In some embodiments, the magnetic core 124 has a top surface substantially level with the metal vias 122 and the metal lines 123. In some embodiments, the magnetic core 124 has a top surface substantially level with the third metallization layer 214. In some embodiments, the magnetic core 124 extends between two adjacent metal vias 122. In some embodiments, magnetic core 124 is not present between one metal via 122 and a metal line 123 adjacent to the metal via 122.

Figure 8:
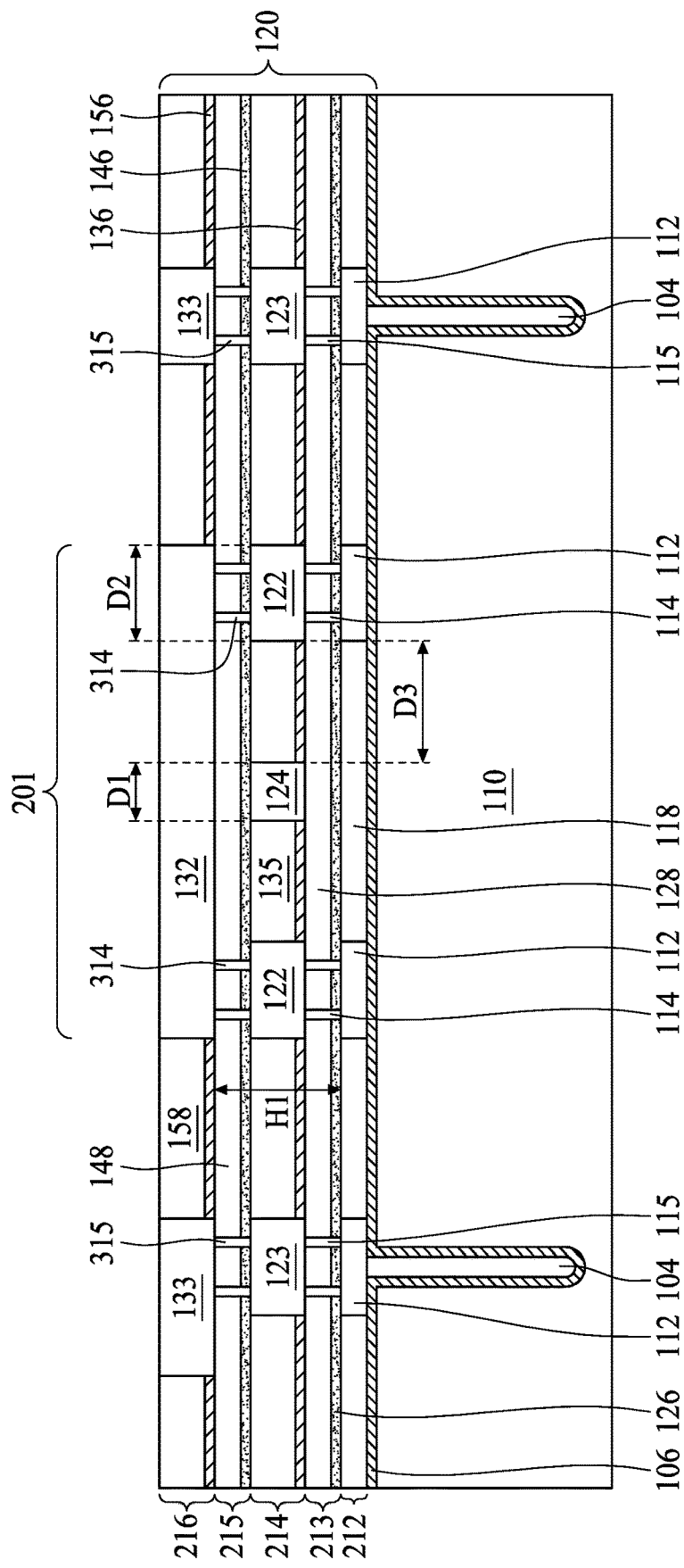

Referring to FIG. 8, a fourth metallization layer 215 and a fifth metallization layer 216 are successively formed over the third metallization layer 214 and the magnetic core 124. The fourth metallization layer 215 includes metal vias 314 and 315 surrounded by an IMD, in which the IMD is formed of a first dielectric layer 146 and a second dielectric layer 148. The metal vias 314 are configured as part of the inductor 200 while the metal vias 315 are configured as part of an interconnection path. In some embodiments, the configuration, materials and methods of formation of the fourth metallization layer 215 are similar to those of the second metallization layer 213. Similarly, the fifth metallization layer 216 includes metal lines 132 and 133 surrounded by an IMD in which the IMD is formed of a first dielectric layer 156 and a second dielectric layer 158. The metal line 132 is configured as part of the inductor 200 and the metal lines 133 are configured as part of an interconnection path. In some embodiments, the configuration, materials and methods of formation of the fifth metallization layer 216 are similar to those of the third metallization layer 214. In the depicted example, the metal line 132 electrically connects two adjacent metal vias 122 at two sides of the magnetic core 124 and extends over the magnetic core 124.

Figure 9A:
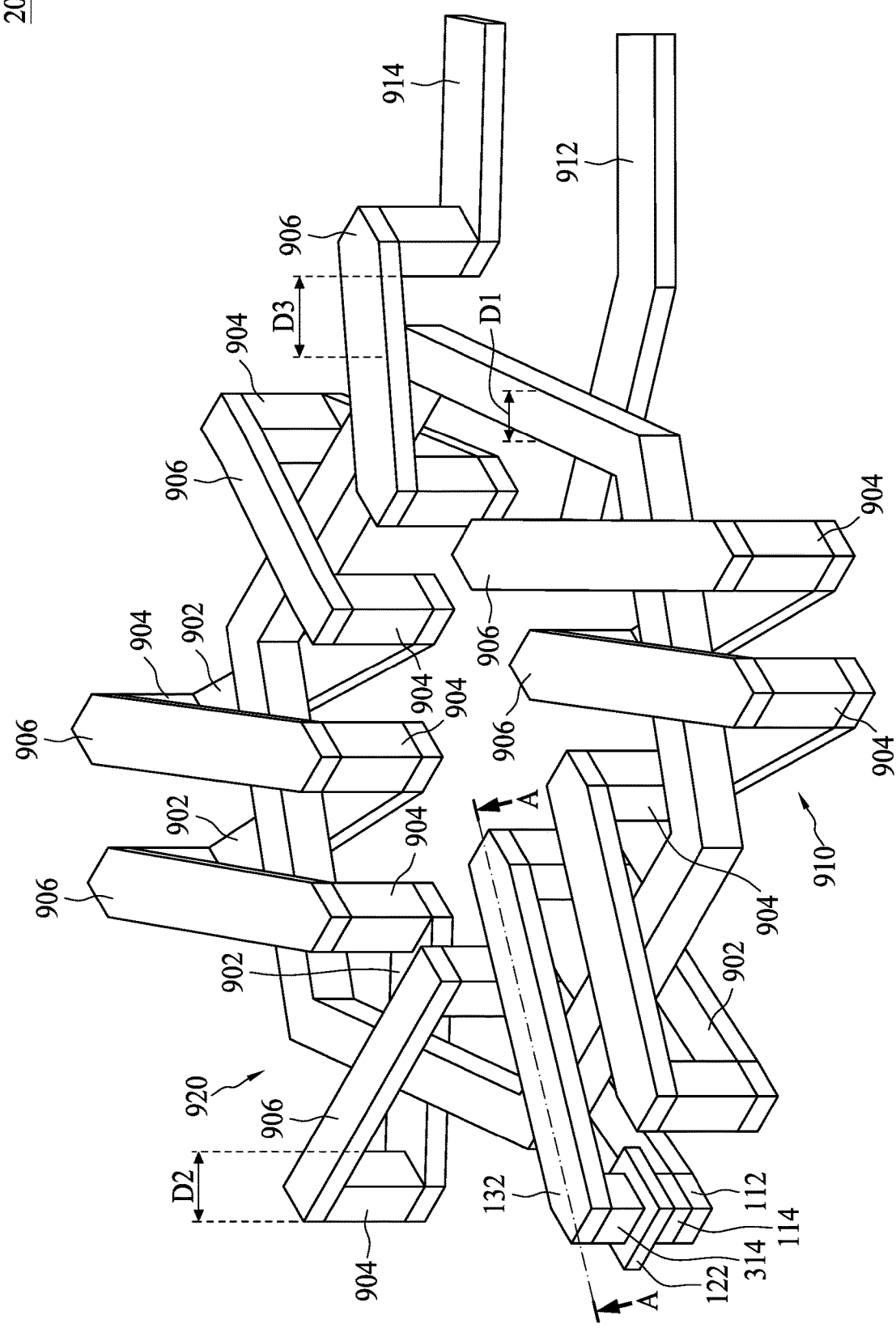
FIGS. 9A and 9B are schematic perspective views of an inductor in a semiconductor package device, in accordance with some embodiments.

FIG. 9A is a schematic perspective view of the inductor 200 in the semiconductor package device 100, in accordance with some embodiments. Referring to FIG. 8 and FIG. 9A, the cross-sectional view of the inductor zone 201 in FIG. 8 is taken from a sectional line AA in FIG. 9A. In FIG. 9A, the inductor 200 includes a conductive coil 910 and a magnetic core 920. The conductive coil 910 is comprised of a bottom metal layer 902, a middle metal layer 904 and a top metal layer 906 interconnected to each other. The metals in the bottom metal layer 902 and top metal layer 906 correspond to the metal lines 112 and 132, respectively, of the interconnect structure 120 in FIG. 8. Further, the illustration of an exemplary middle metal layer 904 on the left side of FIG. 9A shows the details of its structure including the metal vias 114, 122 and 314 corresponding to those of the interconnect structure 120 in FIG. 8. Moreover, the magnetic core 920 of FIG. 9A corresponds to the magnetic core 124 in FIG. 8. It can be seen in FIG. 9A that the conductive coil 910 has a helical shape, which surrounds and winds around the magnetic core 920. In the depicted embodiment, the magnetic core 920 is wound by the conductive coil 910 by nine turns, where one turn is made up of one bottom metal layer 902, two middle metal layers 904 and one top metal layer 906. In some embodiments, the metal lines of the top metal layer 906 are staggered with those in the bottom metal layer 902 in order to form the helical structure of the conductive core 910. Although the conductive coil 910 and the magnetic core 920 may be closely disposed, they are electrically insulated by the IMD, as shown in FIG. 8. In some embodiments, the magnetic core 902 is fully encapsulated by the IMD. In some embodiments, the magnetic core 920 is electrically isolated from other conductive features of the interconnect structure 120.

Still referring to FIG. 9A, an input port 912 and an output port 914 are configured to electrically couple the conductive coil 910 with external conductive features. In some embodiments, the inductor 200 conductively couples to other features through only the input port 912 and the output port 914. In some embodiments, the input port 912 and the output port 914 are disposed at the tier of the bottom metal layer 902 and are formed from the metal lines 112 of the first metallization layer 212. However, depending on design needs, the input port 912 or the output port 914 can be alternatively formed at the tier of the top metal layer 906 and can be formed of the metal lines 132 of the fifth metallization layer 216.

In some embodiments, the magnetic core 920 has a circular shape or a ring shape. In some embodiments, the magnetic core 920 has a polygonal ring shape. In some embodiments, the cross section of the magnetic core 920 has a quadrilateral shape (e.g., square, rectangle or trapezoid), as illustrated by the region of the magnetic core 124 in FIG. 7. Such shape occurs because the recess for forming the magnetic core 124 is formed through a semiconductor etching process. In some embodiments, referring to FIG. 8 or FIG. 9A, a diameter D1 of the magnetic core 124 or 920 is between about 10 μm and about 30 μm. In some embodiments, the diameter D1 is between about 10 μm and about 20 μm. In some embodiments, a diameter D2 of the metal via 122 or the conductive coil 910 is between about 10 μm and about 30 μm. In some embodiments, the diameter D2 is between about 10 μm and about 20 μm. In some embodiments, the diameter D1 is substantially equal to the diameter D2. In some embodiments, a distance D3 between the conductive coil 910 and the magnetic core 920 is between about 10 μm and about 30 μm. In some embodiments, the distance D3 is between about 10 μm and about 30 μm. In some embodiments, a distance between the first metallization layer 212 and the fifth metallization layer 216 is between about 80 μm and 200 μm, for example 100 μm.

Figure 9B:
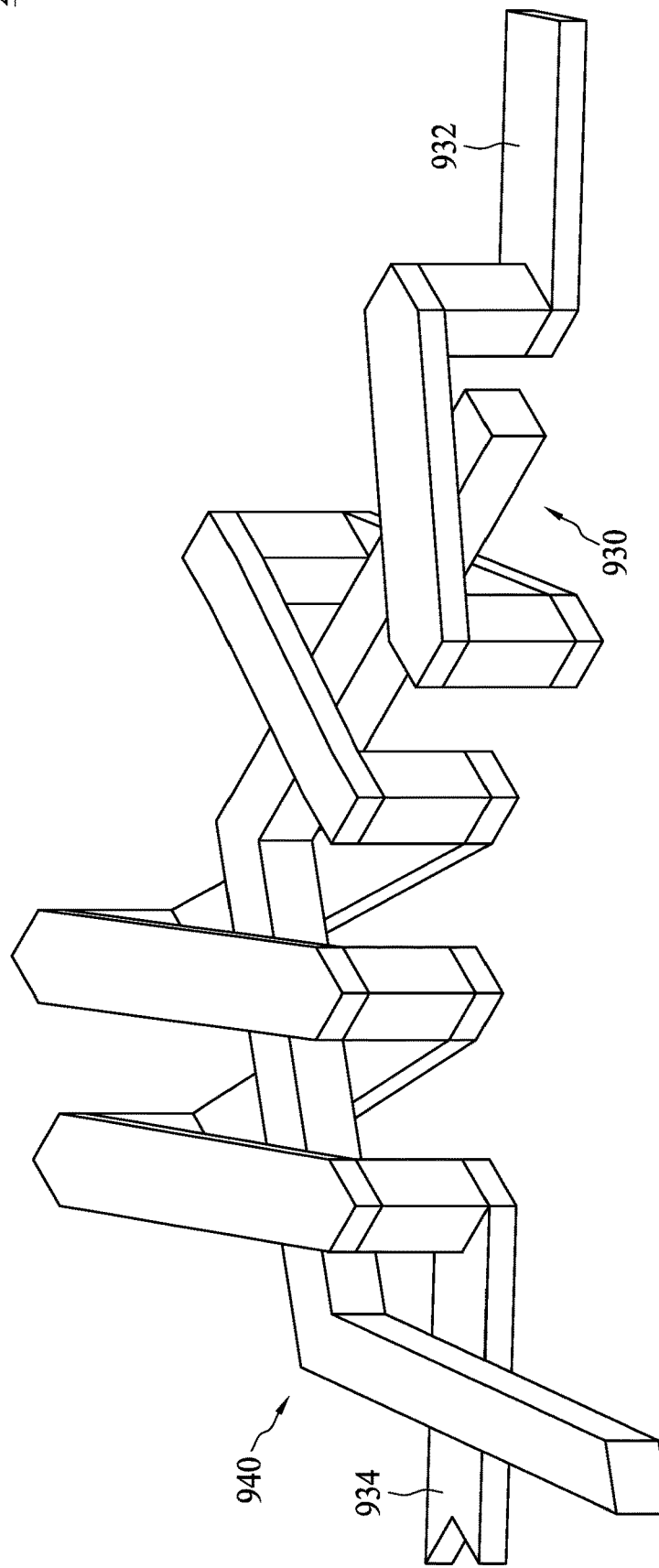

FIG. 9B is a schematic perspective view of an inductor 230 in the semiconductor package device 100, in accordance with some embodiments. The inductor 230 has a conductive coil 930 and a magnetic core 940, around which the conductive coil 930 is wound. Referring to FIG. 9A and FIG. 9B, the inductor 230 is similar to the inductor 200 except that the configuration of the magnetic core 940 has a bar or strip shape. In some embodiments, the magnetic core 940 has two ends extending in substantially opposite directions. In some embodiments, the conductive coil 930 has an input port 932 and an output port 934 at the two ends of the magnetic core 940.

Figure 10:
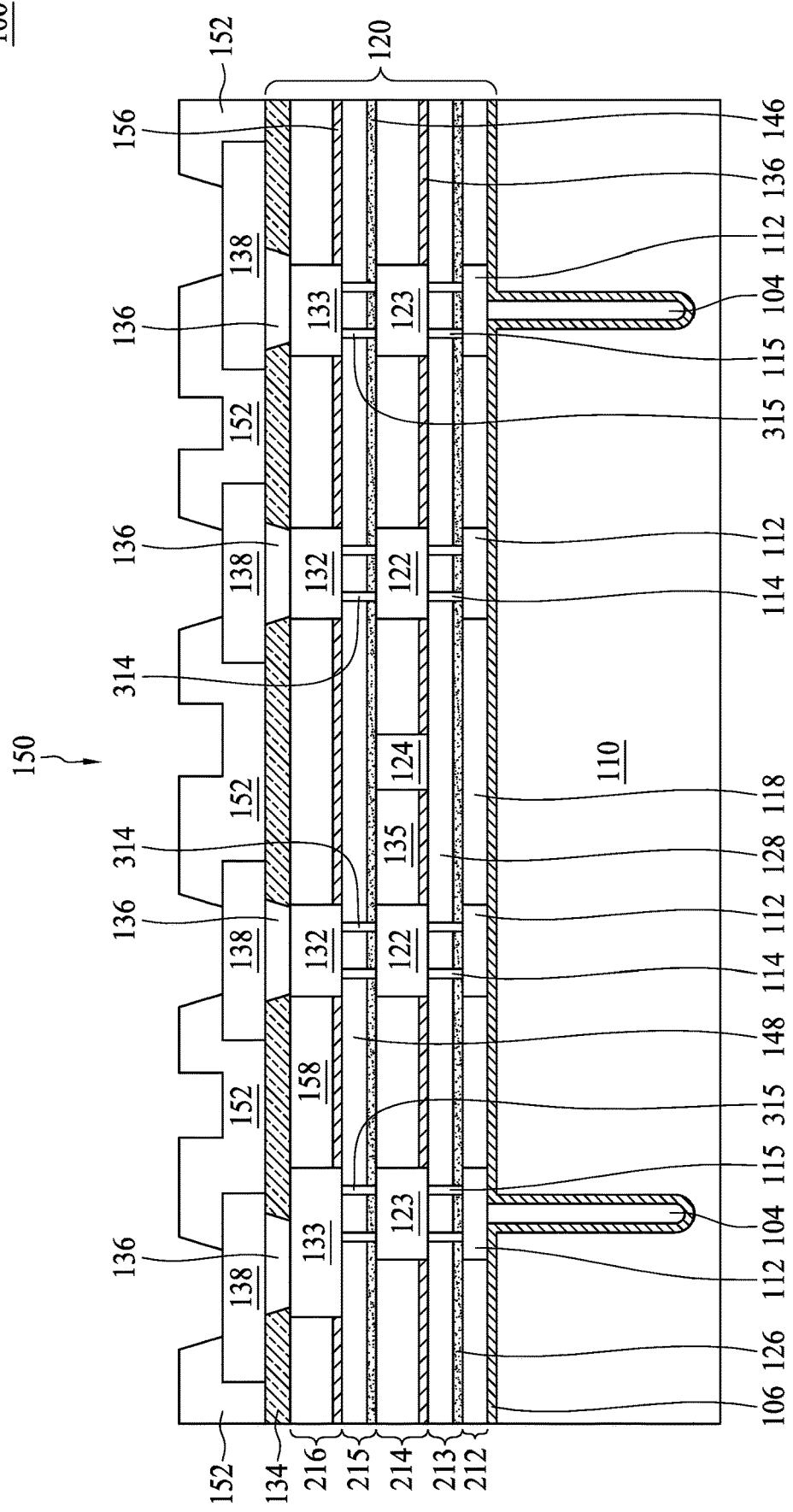

FIG. 10 shows the formation of an insulating film 134 of the interconnect structure 120. The insulating film 134 may be formed of a dielectric material, such as oxide, nitride, oxynitride, carbide, or the like. In some embodiments, the insulating film 134 is formed of the same material as the IMD in the interconnect structure 120. The insulating film 134 may be formed using CVD, PVD, spin-coating, or the like. Subsequently, several conductive vias 136 are formed through the insulating film 134. The material and method of the manufacture of the conductive vias 136 may be similar to those of the metal lines and metal vias in the metallization layers 212 to 216 of the interconnect structure 120. Some of the conductive vias 136 are electrically coupled to the metal lines 133 while some other conductive vias 136 are electrically coupled to the metal lines 132 of the conductive coil.

Several conductive pads 138 are formed on the surface of the insulating film 134 to electrically couple to the conductive vias 136. The conductive pads 138 may be formed of copper, aluminum, tungsten, titanium, combinations thereof, or the like. Next, a passivation layer 152 is formed over the insulating film 134 and the conductive pads 138. The passivation layer 152 may be formed in a blanket manner using CVD, PVD, spin-coating, or the like. The passivation layer 152 may comprise a dielectric material such as oxide, nitride, or oxynitride. Moreover, the passivation 152 is patterned to expose the conductive pads 138. The resultant semiconductor structure in FIG. 10 may be referred to as an interposer die 150.

Figure 11:
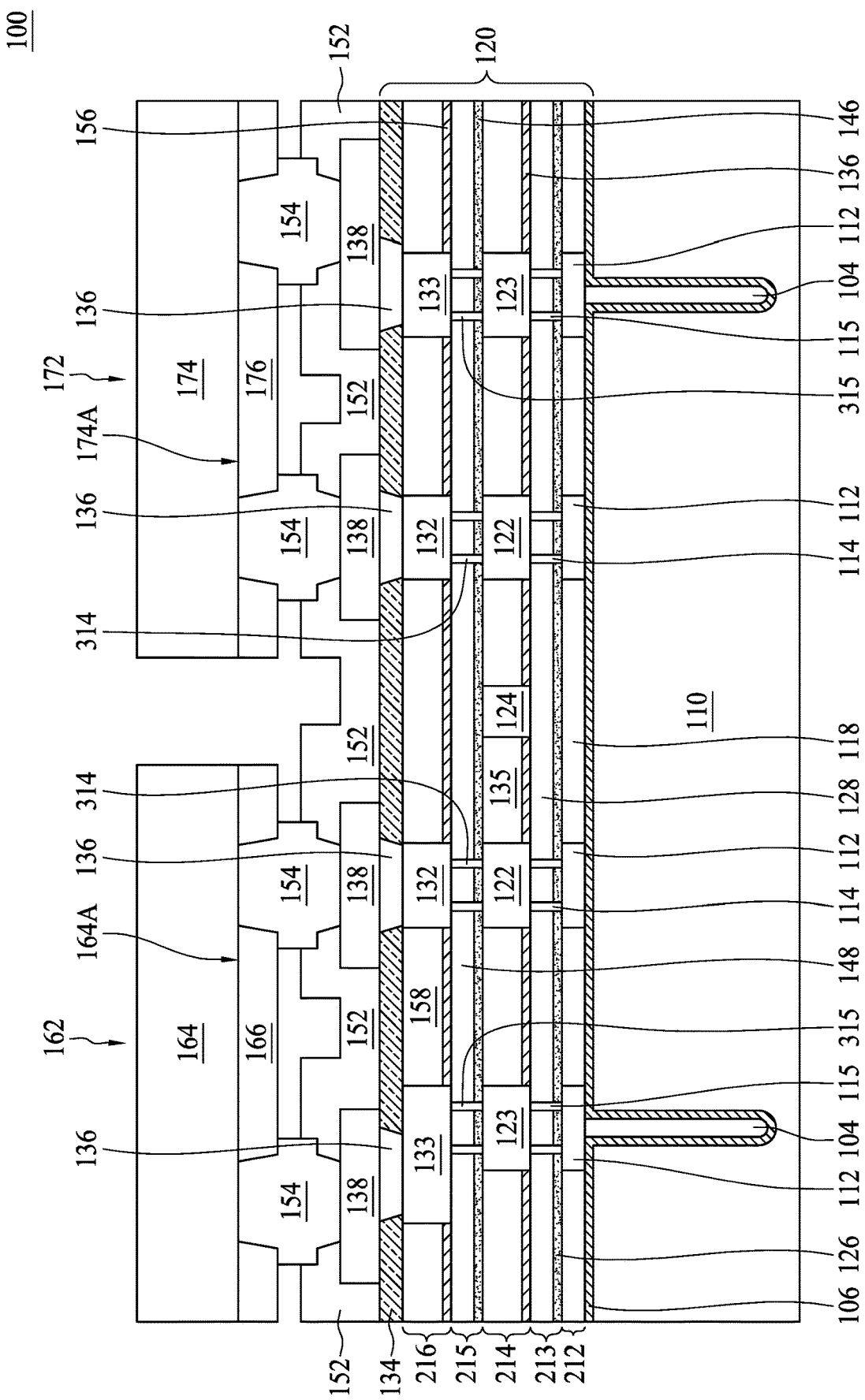

Referring to FIG. 11, a first semiconductor die 162 and a second semiconductor die 172 are provided or received. In some embodiments, the first semiconductor die 162 or the second semiconductor die 172 is a memory device, a processor device, a communication receiver or transmitter, a power management die, a transformer die, or the like. The first semiconductor die 162 and the second semiconductor die 172 comprise a first substrate (also called a die substrate) 164 and a second substrate 174, respectively. The substrate 164 or 174 includes a semiconductor material, such as silicon. In one embodiment, the substrate 164 may include other semiconductor materials, such as silicon germanium, silicon carbide, gallium arsenide, or the like. The substrate 164 or 174 may be a p-type semiconductive substrate (acceptor type) or an n-type semiconductive substrate (donor type).

Various components may be formed on a front surface (front side) 164A of the first substrate 164 and a front surface 174A of the second substrate 174. Examples of the components include active devices, such as transistors and diodes, and passive devices, such as capacitors, inductors, and resistors. The components may also include conductive elements, such as conductive traces or vias, and insulating materials. In addition, the semiconductor die 162 or 172 comprises one or more connection terminals (not illustrated) electrically coupled to external circuits or devices through the connection terminals.

A first passivation layer 166 and a second passivation 176 are formed on the first substrate 164 and the second substrate 174, respectively. The connection terminals of the semiconductor die 162 or 172 are exposed through the first passivation layer 166 or the second passivation layer 172. The first passivation layer 166 or the second passivation layer 176 may be formed of dielectric materials, such as oxide, nitride, or the like. Conductive connectors 154 are formed to bond the interposer die 150 with the semiconductor dies 162 and 172, wherein the connection terminals of the first semiconductor die 162 and the second semiconductor die 172 are electrically coupled to the conductive pads 138 of the interposer die 150. In some embodiments, the conductive connectors 154 may be contact bumps such as controlled collapse chip connection (C4) bumps, ball grid array bumps or microbumps.

Figure 12:
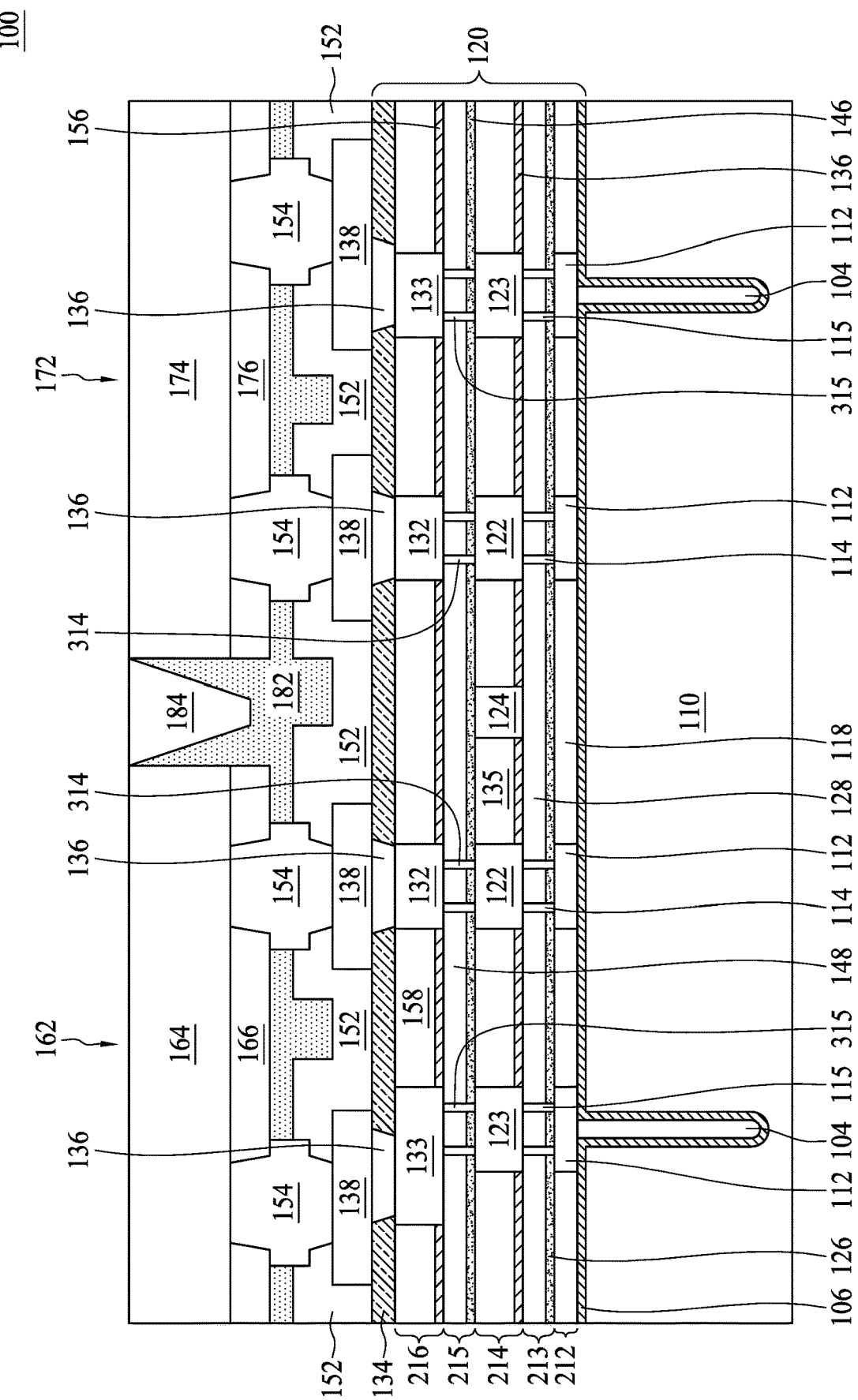

FIG. 12 shows the forming of an encapsulating material 182. The encapsulating material 182 encapsulates or surrounds the conductive connectors 154, the semiconductor dies 162 and 172, and the passivation layer 152 of the interposer die 150. The encapsulating material 182 may include a molded underfill material. In some embodiments, the encapsulating material 182 is formed of epoxy, deformable gel, silicon rubber, thermal plastic polymer, combinations thereof, or the like. In other embodiments, the encapsulating material 182 includes a filler material. The encapsulating material 182 may be formed by dispensing, injecting, or spraying techniques.

Subsequently, an encapsulating material 184 is applied to fill the gap of the encapsulating material 182 between the semiconductor dies 162 and 172. In some embodiments, the encapsulating material 184 fills the gaps between the interposer die 150 and the semiconductor dies 162 and 172. In some embodiments, the encapsulating material 184 includes a molding compound such as polyimide, PPS, PEEK, PES, a molding underfill, an epoxy, a resin, or a combination thereof. The encapsulating material 184 may be formed by dispensing, injecting, or spraying techniques.

Once the molding material 182 or 184 has been formed, a thinning or planarization process may be performed for removing excess encapsulating material 182 or 184. The thinning and planarization operation may be performed using a mechanical grinding or CMP method. In some embodiments, the upper surfaces of the encapsulating materials 182/184 and the semiconductor dies 162 and 172 are substantially level with one another.

Figure 13:
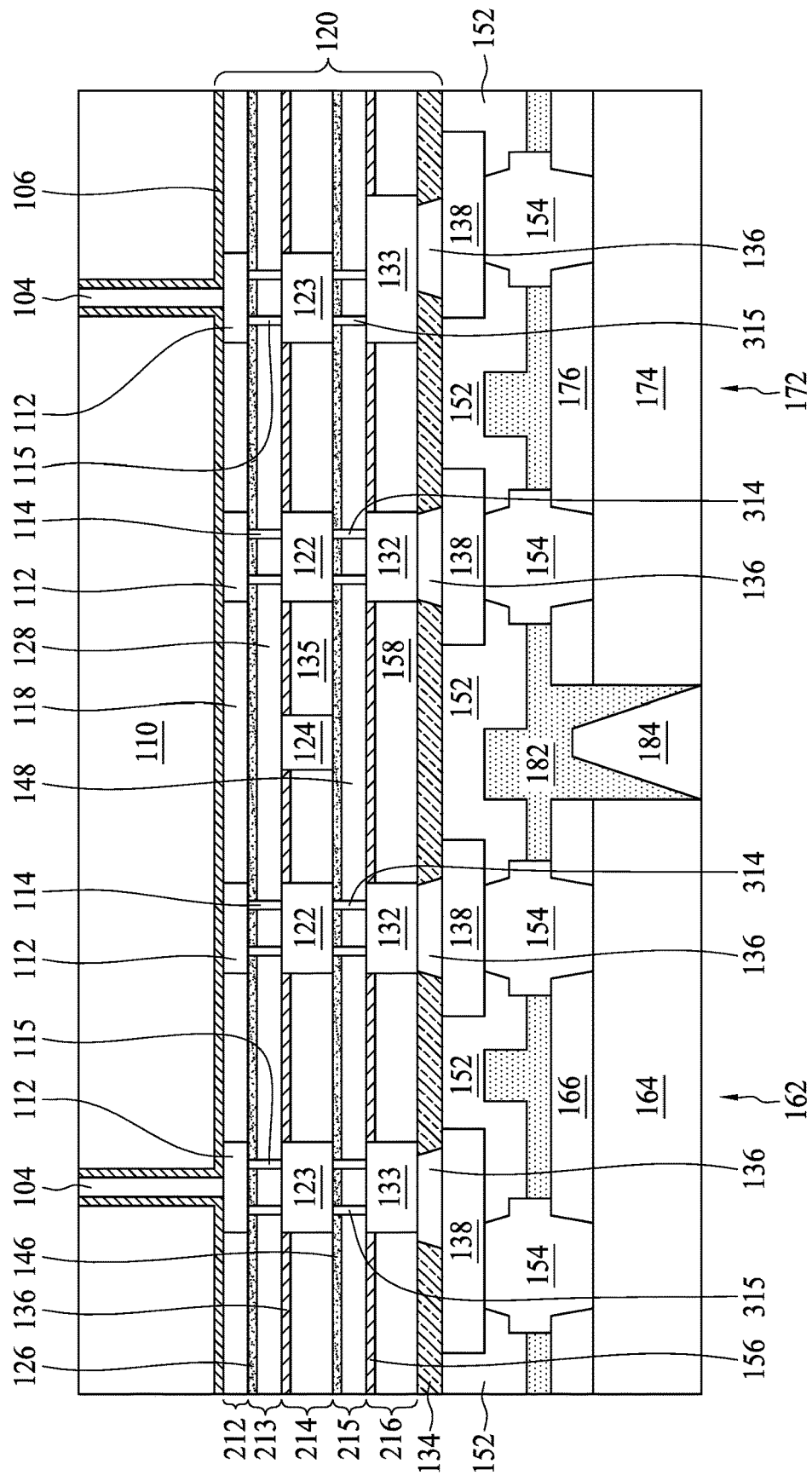
Figure 14:
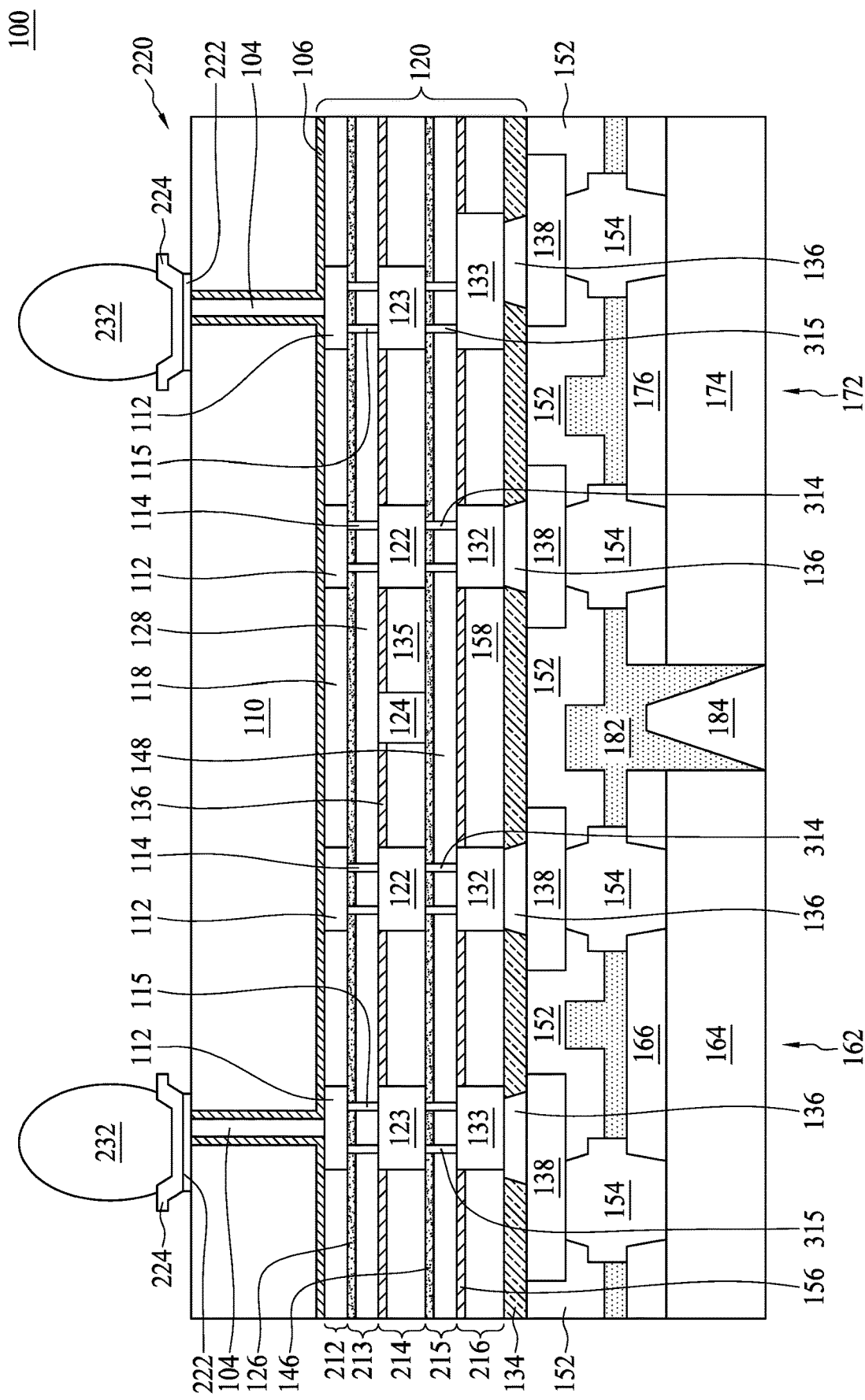

The semiconductor package device 100 is flipped as shown in FIG. 13. A depth of the substrate 110 is removed or thinned so as to expose the bottoms of the conductive vias 104. The thinning and planarization operation may be performed using a mechanical grinding or CMP method. Subsequently, FIG. 14 illustrates a formation of external connectors 232. Initially, a conductive pad 222 and an under bump metallization (UBM) 224 are sequentially formed over the conductive via 104. In some embodiments, the conductive pad 222 may comprise a single layer or a multilayer structure. For example, the conductive pad 222 comprises copper, cooper alloy, tin, nickel, nickel alloy, combinations, or the like. In an embodiment, the UBM 224 may comprise a diffusion barrier layer, a seed layer, or a seed layer over a diffusion barrier layer. In some embodiments, the diffusion barrier layer may include titanium, titanium nitride, tantalum, tantalum nitride, or the like. In some embodiments, the seed layer may comprise copper or copper alloys. The conductive pad 222 and the UBM 224 may be formed by CVD, PVD, sputtering or other suitable methods.

Next, a solder material 232 is formed over the UBM 224. In some embodiments, the solder material 232 comprises lead-based materials, such as Sn, Pb, Ni, Au, Ag, Cu, Bi, combinations thereof, or mixtures of other electrically conductive material. In an embodiment, the solder material 232 is a lead-free material. A thermal process may be performed on the solder material 232, forming an external connector 232. In some embodiments, the external connector 232 comprises a spherical shape. However, other shapes of the external connector 232 may be also possible. In some embodiments, the external connector 156 may be C4 bumps, ball grid array bumps, or microbumps.

The present disclosure provides advantages. The proposed µm-level on-chip inductor is advantageous due to its reduced size and 10-times higher permeability coefficient compared to conventional millimeter-level inductors. In addition, compared to an existing on-chip inductor configuration in which an inductor core made of conductive material is wrapped by a magnetic coil, the proposed inductor adopts a conductive coil winding around a magnetic core. When working in conjunction with an on-chip capacitor in power management applications, the proposed inductor configuration provides a better charging performance than the existing conductive-core configuration.

The present disclosure provides a method, which includes forming an interconnect structure over a semiconductor substrate. The interconnect structure includes: a magnetic core and a conductive coil winding around the magnetic core and electrically insulated from the magnetic core, wherein the conductive coil has horizontally-extending conductive lines and vertically-extending conductive vias electrically connecting the horizontally-extending conductive lines, wherein the magnetic core and the conductive coil are arranged in an inductor zone of the interconnect structure. The vertically-extending conductive vias includes first conductive vias in contact with a first one of the horizontally-extending conductive lines, second conductive vias overlapping the first conductive vias and in contact with a second one of the horizontally-extending conductive lines opposite to the first one of the horizontally-extending conductive lines, and a third conductive via between the first conductive vias and the second conductive vias. The interconnect structure also includes a dielectric material electrically insulating the magnetic core from the conductive coil, and a connecting metal line adjacent to and on the outside of the inductor zone. The connecting metal line is electrical isolated from the inductor zone. The connecting metal line includes an upper surface lower than an upper surface of the second conductive vias and a bottom surface higher than a bottom surface of the first conductive vias.

The present disclosure provides a method, including forming an interconnect structure over a substrate, the interconnect structure including a plurality of metallization layers forming an interconnection path and an inductor electrically isolated from the interconnection path. The plurality of metallization layers includes first metal features in an inductor zone to form a coil of the inductor and includes a magnetic region extending within the coil of the inductor. The coil includes first conductive vias in a first metallization layer, second conductive vias in a second metallization layer over the first metallization layer, and a third conductive via in a third metallization layer between the first conductive vias and the second conductive vias. The interconnect structure further includes second metal features arranged outside the inductor zone, the second metal features including a plurality of connecting metal vias parallel to each other in the first metallization layer or the second metallization layer. Each of the connecting metal vias is electrically isolated from the inductor zone, and has an upper surface and a bottom surface aligned with an upper surface and a bottom surface, respectively, of each of the first or second metal vias.

The present disclosure provides a method, including forming an interconnect structure over a semiconductor substrate, the forming including forming an inductor in an inductor zone, the inductor including a coil and a magnetic core wrapped around by the coil. The forming of the inductor includes: depositing first metal lines in the interconnect structure; depositing the magnetic core over the first layer; depositing metal vias laterally spaced apart from the magnetic core and electrically connected to the first metal lines, wherein the metal vias includes first metal vias arranged in a first metallization layer of the interconnect structure, second metal vias arranged in a second metallization layer of the interconnect structure over the first metallization layer, and a third metal via between the first metallization layer and the second metallization layer; and depositing second metal lines over the metal vias and electrically insulated from the magnetic core. The forming of the interconnect structure further includes: depositing a connecting metal line adjacent to and on the outside of the inductor zone, the connecting metal line being electrical isolated from the inductor zone and having an upper surface and a bottom surface aligned with an upper surface and a bottom surface, respectively, of the magnetic core, and depositing a plurality of connecting metal vias parallel to each other and electrically coupled to the bottom surface or the upper surface of the connecting metal line. Each of the connecting metal vias is electrically isolated from the inductor zone, and has an upper surface and a bottom surface aligned with an upper surface and a bottom surface, respectively, of each of the first or second conductive vias. The method also includes electrically coupling a first semiconductor die to the interconnect structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
forming an interconnect structure over a semiconductor substrate, wherein the interconnect structure comprises:
a magnetic core;
a conductive coil winding around the magnetic core and electrically insulated from the magnetic core, wherein the conductive coil comprises horizontally-extending conductive lines and vertically-extending conductive vias electrically connecting the horizontally-extending conductive lines, wherein the magnetic core and the conductive coil are arranged in an inductor zone of the interconnect structure;
a dielectric material electrically insulating the magnetic core from the conductive coil, and
a connecting metal line adjacent to and on the outside of the inductor zone, the connecting metal line being electrical isolated from the inductor zone,
wherein the vertically-extending conductive vias comprises first conductive vias in contact with a first one of the horizontally-extending conductive lines, second conductive vias overlapping the first conductive vias and in contact with a second one of the horizontally-extending conductive lines opposite to the first one of the horizontally-extending conductive lines, and a third conductive via between the first conductive vias and the second conductive vias,
wherein the connecting metal line includes an upper surface lower than an upper surface of the second conductive vias and a bottom surface higher than a bottom surface of the first conductive vias.

2. The method according to claim 1, wherein the dielectric material comprises at least one of oxide, nitride or carbide.

3. The method according to claim 1, wherein the conductive coil comprises copper.

4. The method according to claim 1, wherein the conductive coil comprises a diameter between about 10 µm and about 20 µm.

5. The method according to claim 1, wherein the magnetic core comprises cobalt, tantalum and zirconium.

6. The method according to claim 1, wherein the conductive coil comprises a first metal layer, a second metal layer and a third metal layer, and the magnetic core is disposed at a tier the same as a tier of the second metal layer.

7. The method according to claim 6, wherein the first metal layer comprises a first metal line overlapping the magnetic core, the third metal layer comprises a second metal line overlapping the magnetic core, and the first metal line and the second metal line extend in different directions.

8. The method according to claim 1, wherein the magnetic core comprises a ring shape from a top-view perspective.

9. The method according to claim 1, further comprising bonding a first semiconductor die to the interconnect structure and electrically coupled to the conductive coil of the interconnect structure.

10. A method, comprising:
forming an interconnect structure over a substrate, the interconnect structure comprising a plurality of metallization layers forming an interconnection path and an inductor electrically isolated from the interconnection path, wherein the plurality of metallization layers comprise:
first metal features in an inductor zone to form a coil of the inductor and comprise a magnetic region extending within the coil of the inductor, wherein the coil comprises first conductive vias in a first metallization layer, second conductive vias in a second metallization layer over the first metallization layer, and a third conductive via in a third metallization layer between the first conductive vias and the second conductive vias; and
second metal features arranged outside the inductor zone, the second metal features including a plurality of connecting metal vias parallel to each other in the first metallization layer or the second metallization layer, wherein each of the connecting metal vias is electrically isolated from the inductor zone, and has an upper surface and a bottom surface aligned with an upper surface and a bottom surface, respectively, of each of the first or second conductive vias.

11. The method according to claim 10, wherein a distance between the coil and the magnetic region of the inductor is between about 10 µm and about 20 µm.

12. The method according to claim 10, further comprising forming a conductive bump on a surface of the substrate opposite the interconnect structure to electrically couple a first semiconductor die to a second semiconductor die through the interconnect structure.

13. The method according to claim 12, further comprising forming a conductive connector electrically coupling the interconnect structure to the first semiconductor die.

14. The method according to claim 13, further comprising encapsulating the interconnect structure, the first semiconductor die and the conductive connector with a dielectric material.

15. The method according to claim 10, wherein the first conductive vias are aligned with the corresponding second conductive vias.

16. A method, comprising:
forming an interconnect structure over a semiconductor substrate, the forming comprising:
forming an inductor in an inductor zone, the inductor comprising a coil and a magnetic core wrapped around by the coil, the forming of the inductor comprising:
depositing first metal lines in the interconnect structure;
depositing the magnetic core over the first metal lines;
depositing metal vias laterally spaced apart from the magnetic core and electrically connected to the first metal lines, wherein the metal vias comprises first metal vias arranged in a first metallization layer of the interconnect structure, second metal vias arranged in a second metallization layer of the interconnect structure over the first metallization layer, and a third metal via between the first metallization layer and the second metallization layer; and
depositing second metal lines over the metal vias and electrically insulated from the magnetic core;
depositing a connecting metal line adjacent to and on the outside of the inductor zone, the connecting metal line being electrical isolated from the inductor zone and having an upper surface and a bottom surface aligned with an upper surface and a bottom surface, respectively, of the magnetic core; and
depositing a plurality of connecting metal vias parallel to each other and electrically coupled to the bottom surface or the upper surface of the connecting metal line, wherein each of the connecting metal vias is electrically isolated from the inductor zone, and has an upper surface and a bottom surface aligned with an upper surface and a bottom surface, respectively, of each of the first or second metal vias; and
electrically coupling a first semiconductor die to the interconnect structure.

17. The method according to claim 16, wherein the third metal via comprises an upper surface substantially level with an upper surface of the magnetic core.

18. The method according to claim 16, wherein the forming of the interconnect structure further comprises:
forming a first dielectric layer laterally surrounding the first metal vias; and
forming a second dielectric layer over the first dielectric layer and laterally surrounding the first metal vias, wherein the second dielectric layer overlaps the bottom surface of the third metal via.

19. The method according to claim 18, further comprising forming a third dielectric layer and a fourth dielectric layer, different from the third dielectric layer, over the third dielectric layer, wherein the third and fourth dielectric layers are disposed over the third metal via and separating the second metal vias.

20. The method according to claim 16, wherein some of the first metal lines are parallel to each other and extend in a first direction, and some of the second metal lines are parallel to each other and extend in a second direction different from the first direction.

* * * * *